(12) United States Patent
Patel et al.

(10) Patent No.: US 10,797,232 B2
(45) Date of Patent: Oct. 6, 2020

(54) LOW RESISTANCE MGO CAPPING LAYER FOR PERPENDICULARLY MAGNETIZED MAGNETIC TUNNEL JUNCTIONS

(71) Applicant: Taiwan Semiconductor Manufacturing Company, Ltd., Hsinchu (TW)

(72) Inventors: Sahil Patel, Fremont, CA (US); Guenole Jan, San Jose, CA (US); Ru-Ying Tong, Los Gatos, CA (US); Vignesh Sundar, Sunnyvale, CA (US); Dongna Shen, San Jose, CA (US); Yu-Jen Wang, San Jose, CA (US); Po-Kang Wang, Los Altos, CA (US); Huanlong Liu, Sunnyvale, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/728,061

(22) Filed: Dec. 27, 2019

(65) Prior Publication Data

US 2020/0136025 A1    Apr. 30, 2020

Related U.S. Application Data

(62) Division of application No. 15/841,479, filed on Dec. 14, 2017, now Pat. No. 10,522,745.

(51) Int. Cl.
*H01L 43/08* (2006.01)
*H01L 27/22* (2006.01)
*H01L 43/10* (2006.01)
*H01L 43/12* (2006.01)

(52) U.S. Cl.
CPC ............ *H01L 43/08* (2013.01); *H01L 27/222* (2013.01); *H01L 43/10* (2013.01); *H01L 43/12* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0202924 A1* | 10/2004 | Tao | ...................... | H01M 4/9041 429/102 |
| 2008/0180991 A1* | 7/2008 | Wang | ...................... | G11C 11/15 365/171 |

(Continued)

*Primary Examiner* — Ratisha Mehta
(74) *Attorney, Agent, or Firm* — Haynes and Boone, LLP (57) ABSTRACT

A magnetic tunnel junction (MTJ) is disclosed wherein a free layer (FL) interfaces with a first metal oxide (Mox) layer and second metal oxide (tunnel barrier) to produce perpendicular magnetic anisotropy (PMA) in the FL. In some embodiments, conductive metal channels made of a noble metal are formed in the Mox that is MgO to reduce parasitic resistance. In a second embodiment, a discontinuous MgO layer with a plurality of islands is formed as the Mox layer and a non-magnetic hard mask layer is deposited to fill spaces between adjacent islands and form shorting pathways through the Mox. In another embodiment, end portions between the sides of a center Mox portion and the MTJ sidewall are reduced to form shorting pathways by depositing a reducing metal layer on Mox sidewalls, or performing a reduction process with forming gas, $H_2$, or a reducing species.

20 Claims, 8 Drawing Sheets

(56) References Cited

U.S. PATENT DOCUMENTS

2010/0315863 A1* 12/2010 Zhu ..................... B82Y 25/00
                                                  365/158
2014/0306302 A1* 10/2014 Jan ......................... H01L 43/10
                                                  257/421

* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | −7 |
| Ru | $RuO_2$ | −253 |
| Cu | CuO | −254 |
| Co | CoO | −426 |
| Ni | NiO | −432 |
| Fe | FeO | −488 |
| Fe | $Fe_2O_3$ | −495 |
| Mo | $MoO_2$ | −502 |
| W | $WO_3$ | −509 |
| Sn | SnO | −514 |
| Zn | ZnO | −636 |
| Cr | $Cr_2O_3$ | −699 |
| Nb | $Nb_2O_5$ | −708 |
| Ta | $Ta_2O_5$ | −788 |
| B | $B_2O_3$ | −796 |
| Si | $SiO_2$ | −805 |
| Mn | $Mn_2O_3$ | −854 |
| Ti | $TiO_2$ | −890 |
| Zr | $ZrO_2$ | −1037 |
| Al | $Al_2O_3$ | −1053 |
| Ba | BaO | −1056 |
| Hf | $HfO_2$ | −1084 |
| Mg | MgO | −1146 |
| Ca | CaO | −1208 |

FIG. 20

LOW RESISTANCE MGO CAPPING LAYER FOR PERPENDICULARLY MAGNETIZED MAGNETIC TUNNEL JUNCTIONS

PRIORITY DATA

The present application is a divisional application of U.S. patent application Ser. No. 15/841,479, filed Dec. 14, 2017, which is incorporated by reference herein in its entirety.

RELATED PATENT APPLICATIONS

This application is related to the following: U.S. Pat. Nos. 8,981,505; 9,006,704; and 9,230,571, which are assigned to a common assignee and herein incorporated by reference in their entirety.

TECHNICAL FIELD

The present disclosure relates to a magnetic tunnel junction (MTJ) comprised of a free layer that interfaces with a tunnel barrier layer and a metal oxide cap layer, and in particular to a reduction in the cap layer resistance in order to mitigate the reduction in magnetoresistive ratio by decreasing the parasitic resistance observed with a cap layer having a fully oxidized state.

BACKGROUND

Perpendicularly magnetized MTJs (p-MTJs) are a major emerging technology for use as embedded magnetic random access memory (MRAM) applications, and standalone MRAM applications. P-MTJ MRAM technology using spin-torque (STT-MRAM) for writing of memory bits was described by J. C. Slonczewski in "Current driven excitation of magnetic multilayers", J. Magn. Magn. Mater. V 159, L1-L7 (1996), and is highly competitive with existing semiconductor memory technologies such as SRAM, DRAM, and flash.

Both MRAM and STT-MRAM have a MTJ element based on a tunneling magnetoresistance (TMR) effect wherein a MTJ stack of layers has a configuration in which two ferromagnetic layers are separated by a thin insulating tunnel barrier layer. One of the ferromagnetic layers called the pinned layer has a magnetic moment that is fixed in an out-of-plane direction such as the +z direction when the plane of each layer is laid out in the x-axis and y-axis directions. The second ferromagnetic layer has an out-of-plane magnetization direction that is free to rotate to either the +z (parallel or P state) or the −z (antiparallel or AP state). The difference in resistance between the P state (Rp) and AP state (Rap) is characterized by the equation (Rap−Rp)/Rp that is also known as DRR. It is important for MTJ devices to have a large DRR value, preferably higher than 1, as DRR is directly related to the read margin for the memory bit, or how easy it is to differentiate between the P state and AP state (0 or 1 bits).

When the free layer has a magnetization direction perpendicular to the plane of the film, the critical current (Ic) needed to switch the magnetic element is directly proportional to the perpendicular anisotropy field as indicated in Equation (1) where e is the electron charge, a is a Gilbert damping constant, Ms is the saturation magnetization of the free layer, h is the reduced Plank's constant, g is the gyromagnetic ratio, and $H_{k_{eff}}^{\perp}$ out-of-plane anisotropy field of the magnetic region to switch, and V is the volume of the free layer:

$$i_c = \frac{\alpha e M s V H_{k_{eff},\perp}}{g\hbar} \qquad \text{Eq. (1)}$$

The value $A=kV/k_BT$ is a measure of the thermal stability of the magnetic element where kV is also known as k/B or the energy barrier between the two magnetic states (P and AP), $k_B$ is the Boltzmann constant and T is the temperature. For functional MRAM products, the free layer (information storage layer) must have a high enough $E_b$ to resist switching due to thermal and magnetic environmental fluctuations. This energy barrier to random switching is related to the strength of the perpendicular magnetic anisotropy (PMA) of the free layer. One practical way to obtain strong PMA is through interfacial PMA at an interface between a CoFeB free layer and an MgO tunnel barrier layer. Even higher PMA is achieved by forming a second MgO interface for additional interfacial PMA on an opposite side of the free layer with respect to the tunnel barrier. Therefore, total PMA in the free layer is optimized with an MgO/CoFeB/MgO stack in the p-MTJ thereby increasing $E_b$.

Figure 1:
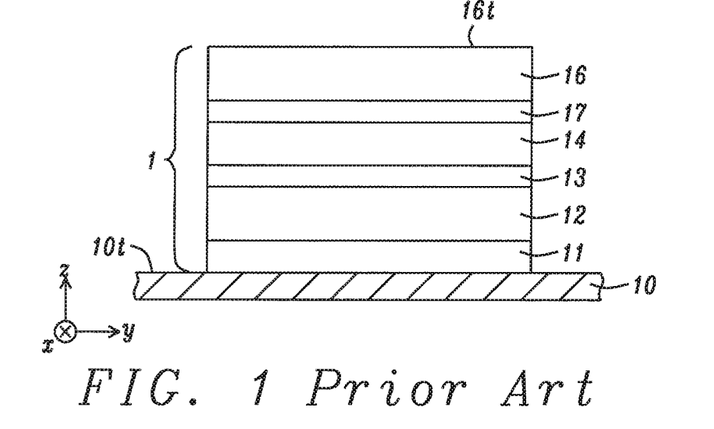
FIG. 1 is a cross-sectional view showing a perpendicularly magnetized magnetic tunnel junction (p-MTJ) wherein a free layer is formed between two uniform metal oxide layers according the prior art.

FIG. 1 depicts a conventional p-MTJ 1 wherein an optional seed layer 11, pinned layer 12, tunnel barrier 13, free layer 14, metal oxide cap layer 17, and hard mask 16 are sequentially formed on a substrate that is a bottom electrode 10 in a MRAM structure, for example. Unfortunately, a consequence of employing an MgO cap layer is the addition of parasitic resistance to the p-MTJ device. Equation (2) shows the effect of the cap layer resistance contribution to total MTJ resistance while Equation (3) indicates the impact on DRR.

$$DRR = \frac{R_{AP} - R_P}{R_P} \text{ where} \qquad \text{Eq. (2)}$$

$$R_{AP} = R_{AP}^{barrier} + R_{AP}^{cap} \text{ and } R_P = R_P^{barrier} + R_P^{cap}$$

$$\text{Since } R_P^{cap} = R_P^{cap}$$

$$DRR = \frac{R_{AP}^{barrier} + R_{AP}^{cap} - (R_P^{barrier} + R_P^{cap})}{R_P^{barrier} + R_P^{cap}} = \frac{R_{AP}^{barrier} - R_P^{barrier}}{R_P^{barrier} + R_P^{cap}} \qquad \text{Eq. (3)}$$

In summary, the series resistance caused by the metal oxide cap layer ($R_{AP}^{cap}$ and $R_p^{cap}$) will cause a reduction in DRR, effectively reducing the MRAM bit reading margin, as well as increasing the bit's writing voltage by adding a series resistance. Since an MgO cap layer or the like is required to achieve strong PMA for enhanced thermal stability, an improved p-MTJ structure is needed such that strong PMA is maintained while significantly reducing the series resistance contribution from the cap layer.

SUMMARY

One objective of the present disclosure is to reduce the cap layer resistance and resistance×area (RA) product for p-MTJ nanopillars wherein a metal oxide layer interfaces with both top and bottom surfaces of a free layer thereby improving DRR and reducing the writing voltage while maintaining high PMA for thermal stability.

A second objective is to provide a method of forming the p-MTJ of the first objective that is readily implemented in memory device fabrication.

According to the present disclosure, there is a plurality of schemes whereby the aforementioned objectives are achieved. In a first embodiment where a free layer is formed between a tunnel barrier layer and a metal oxide cap layer, the metal oxide layer preferably has a substantial number of unoxidized metal atoms such that there are metal (conductive) channels between top and bottom surfaces of the metal oxide layer to lower the resistance therein. Thus, unoxidized Mg pathways may be formed within an MgO layer, for example. In alternative embodiments, a noble metal (NM) may be co-deposited with Mg followed by oxidation of Mg, or a Mg/NM/Mg stack may be formed prior to oxidation, or a process comprised of Mg deposition and oxidation, then NM deposition, and then Mg deposition and oxidation is used to yield NM conductive pathways within a MgO layer.

According to a second embodiment, a metal such as Mg is formed as a discontinuous layer in the form of islands on the free layer by a physical vapor deposition (PVD). Thereafter, an oxidation step is performed to transform the irregular island shapes to a discontinuous MgO layer. Subsequently, a non-magnetic metal hard mask layer is deposited to form metal pathways through the discontinuous MgO layer to effectively reduce the resistive contribution of the MgO cap layer to the total RA product of the p-MTJ.

According to a third embodiment, outer portions of a continuous MgO cap layer that are formed proximate to MTJ nanopillar sidewalls are reduced to provide conductive pathways around the center portion of the MgO layer. Outer metal oxide portions may be reduced with the application of forming gas, $H_2$, or a reducing agent species during the p-MTJ etch process. In some embodiments, the outer portions of the MgO layer at p-MTJ sidewalls are reduced to an unoxidized state by contact with a reducing metal in a subsequently deposited encapsulation layer. For example, oxygen in the MgO layer may diffuse into the encapsulation layer thereby lowering the oxygen content in outer portions of the MgO layer in the p-MTJ.

The present disclosure also encompasses a method of forming a metal oxide layer with reduced resistivity that is found in the aforementioned embodiments. For example, the outer portions of an MgO cap layer in the third embodiment may be partially reduced to a non-stoichiometric oxidation state or totally reduced to Mg by interrupting the MTJ etch after a sidewall is formed along the cap layer. Then, a forming gas treatment, $H_2$ treatment, exposure to a reducing species or depositing a reducing metal layer is performed before continuing the p-MTJ etch to form a sidewall along the free layer, tunnel barrier layer, and underlying layers. As a result, the MgO tunnel barrier maintains a substantially stoichiometric oxidation state to optimize DRR.

In other embodiments of the present disclosure that relate to top spin valve configurations for the p-MTJ, the free layer is formed between an underlying metal oxide layer called a Hk enhancing layer, and an overlying tunnel barrier layer. As in the previously described bottom spin valve embodiments, the metal oxide layer has conductive channels that extend between top and bottom surfaces thereof to provide an electric shorting pathway as a means of lowering parasitic resistance.

BRIEF DESCRIPTION OF THE DRAWINGS

FIG. 3b illustrates the sputter deposition of a metal or metal oxide layer on the stack of layers from FIG. 3a.

DETAILED DESCRIPTION

The present disclosure is related to p-MTJ nanopillars and the fabrication thereof wherein a free layer forms a first interface with a tunnel barrier layer and a second interface with a metal oxide layer, and conductive channels are formed within or around the metal oxide layer to mitigate the parasitic resistance and lower DRR associated with a uniform metal oxide layer that does not have a tunneling magnetoresistance effect. Although the exemplary embodiments depict p-MTJ nanopillars with bottom spin valve and top spin valve configurations, the present disclosure also encompasses a p-MTJ having a dual spin valve structure as appreciated by those skilled in the art. The p-MTJ may be incorporated in a MRAM, STT-MRAM, sensor, biosensor, or another spintronic device such as a spin torque oscillator (STO). Only one p-MTJ nanopillar is depicted in the drawings, but typically millions of p-MTJ nanopillars are arrayed in rows and columns on a substrate during fabrication of a memory device. The terms "oxidation state" and "oxygen content" may be used interchangeably when describing the condition of the metal oxide layer. Conductive channels may have a width that is a plurality of metal atoms in a direction that is parallel to the plane of the metal oxide layer. A top surface for a layer is defined as a surface facing away from the substrate while a bottom surface faces the substrate. An interface is a boundary region comprised of a bottom surface of one layer and an adjoining top surface of a second layer.

In related U.S. Pat. No. 9,006,704, we disclosed a Hk enhancing layer with a metal oxide composition to enhance perpendicular magnetic anisotropy (PMA) in an adjoining free layer, and where the metal oxide is embedded with conductive particles of Co, Fe, Ni, or the like to reduce resistivity therein. Also, in related U.S. Pat. No. 9,230,571, we disclosed a STO structure wherein a capping layer has a confining current pathway (CCP) configuration comprised of metal channels within a metal oxide matrix. Generally, the metal channels are made of Cu, which is a different metal from the metal in the metal oxide matrix.

Now we have found additional schemes to reduce parasitic resistance in a metal oxide layer that interfaces with a free layer, and is formed on an opposite side of the free layer with respect to a tunnel barrier layer. All embodiments described herein involve forming one or more conductive pathways through or around the metal oxide layer that adjoins a top or bottom surface of the free layer. Although each embodiment comprises a key feature to enable lower resistivity, the present disclosure anticipates that a concept from one scheme may be incorporated in another scheme to further enhance a reduction in resistance through the metal oxide layer as explained later.

As indicated previously, a p-MTJ nanopillar 1 was fabricated by the inventors according to a process of record (POR) scheme and includes a stack of layers wherein a free layer 14 is sandwiched between a tunnel barrier layer 13 and a metal oxide cap layer 17 to enhance PMA and thermal stability in the free layer. However, an improved p-MTJ nanopillar is needed in order to reduce the effect of a lower DRR as a result of the cap layer's substantial contribution in resistance $R_p^{cap}$ to the sum in the denominator on the right side of Equation (3).

Figure 2:
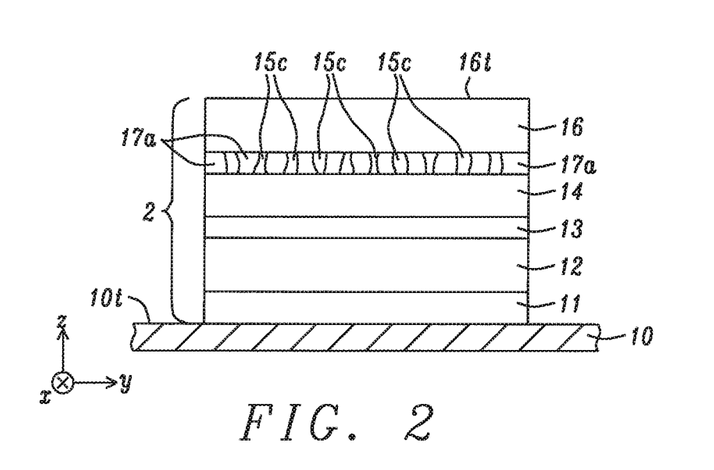
FIG. 2 is a cross-sectional view of a p-MTJ according to a first embodiment of the present disclosure wherein conductive channels are formed within the metal oxide layer and contact a top surface of the free layer.

According to a first embodiment of the present disclosure shown as p-MTJ 2 in FIG. 2, we have found that resistivity in a metal oxide layer 17a is considerably reduced by forming metal channels 15c or conductive pathways therein. P-MTJ 2 has an optional seed layer 11 formed on a bottom electrode 10, and reference layer 12, tunnel barrier 13, free layer 14, metal oxide layer 17a, and hard mask 16 are sequentially formed on the seed layer. The seed layer is comprised of one or more of NiCr, Ta, Ru, Ti, TaN, Cu, Mg, or other materials typically employed to promote a smooth and uniform grain structure in overlying layers.

Reference layer 12 may have a synthetic anti-parallel (SyAP) configuration represented by AP2/Ru/AP1 where an antiferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. AP1 and AP2 layers may be comprised of CoFe, CoFeB, Co, or a combination thereof. In other embodiments, the reference layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer 13.

Tunnel barrier layer 13 is preferably a metal oxide that is one of MgO, TiOx, AlTiO, MgZnO, $Al_2O_3$, ZnO, ZrOx, MgAlOx, MgGaOx, HfOx, or MgTaO, or a lamination of one or more of the aforementioned metal oxides. More preferably, MgO is selected as the tunnel barrier layer because it provides the highest magnetoresistive ratio (DRR), especially when sandwiched between two CoFeB layers, for example.

Free layer 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to the reference layer composition.

Hard mask 16 is non-magnetic and generally comprised of one or more conductive metals or alloys including but not limited to Ta, Ru, TaN, Ti, TiN, and W. It should be understood that other hard mask materials including MnPt may be selected in order to provide high etch selectivity relative to underlying MTJ layers during an etch process that forms MTJ nanopillars with sidewalls that stop on the bottom electrode. In other embodiments, the hard mask is a conductive non-magnetic layer that is one or more of RuOx, ReOx, IrOx, MnOx, MoOx, TiOx, and FeOx.

Preferably, metal oxide layer 17a has a composition selected from one of MgO, AlOx, TiOx, MgTiOx, AlTiO, MgZnO, MgAlOx, ZnO, ZrOx, MgZrOx, HfOx, SrTiOx, BaTiOx, CaTiOx, LaAlOx, VOx, and MgTaO wherein the one or more metals in the aforementioned metal oxides are a M1 metal or alloy. In some embodiments, the metal channels 15c formed therein are comprised of the same M1 metal or alloy as in the metal oxide layer unlike a CCP structure. Thus, Mg channels are formed in a MgO oxide layer by first depositing a Mg layer on the free layer 14. Then, a natural oxidation (NOX) is performed whereby a substantial number of Mg atoms remain unoxidized (non-stoichiometric oxidation state) by one or both of reducing the flow rate of oxygen and shortening the reaction time compared with a standard NOX process where a Mg layer is transformed to a MgO layer with a stoichiometric oxidation state (essentially no unoxidized Mg atoms remaining). Note that the channels do not necessarily have a substantially vertical alignment, or a uniform width in the x-axis and y-axis directions, but each channel contacts a top surface of the free layer and a bottom surface of the hard mask 16 in p-MTJ 2 that has a bottom spin valve configuration.

The present disclosure also anticipates that the metal channels 15c may be comprised of a different metal than in the metal oxide layer 17a. According to another embodiment where the metal oxide is selected to be MgO, a first Mg layer is deposited on free layer 14 followed by deposition of a noble metal (NM) layer on the first Mg layer, and then a second Mg layer on the NM layer. All layers are preferably RF or DC sputter deposited by a conventional process. Subsequently, an oxidation step is performed to oxidize a substantial portion of the deposited Mg atoms to yield a MgO matrix in which NM channels are formed. Note that another M1 metal or alloy may be substituted for Mg in the first A layer of FIG. 3a, and during deposition of the second A layer in FIG. 3b.

Figure 3A:
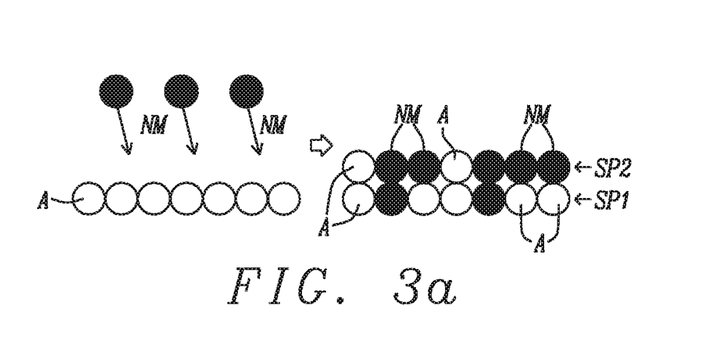
FIG. 3a depicts the sputter deposition of a noble metal on a metal or metal oxide layer.
Figure 3B:
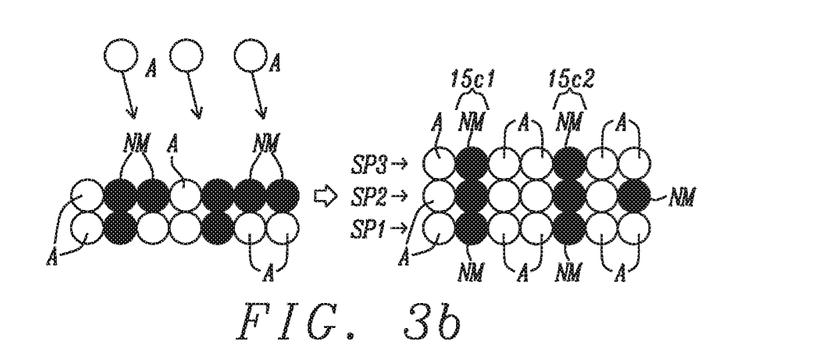

Referring to FIG. 3a, the first step of depositing a NM layer on a metal (A) layer is shown. It should be understood that during deposition of NM atoms on the first A (M1 metal or alloy) layer, a certain number of the A atoms are dislodged (resputtered) and co-deposited with the NM atoms. As a result, the bottom layer SP1 may contain a plurality of NM atoms, and the second layer SP2 may comprise a plurality of A atoms following the NM deposition. Thereafter, in FIG. 3b, during deposition of a second A layer, a number of NM atoms may be dislodged from the second layer and co-deposited with A atoms in the third or uppermost layer SP3. Thus, a stack of NM atoms from the bottom, second, and uppermost layers SP1-SP3 may form a first channel 15c1, and a second stack of NM atoms forms a second conductive channel 15c2. Only two channels are shown to simplify the drawing. However, a plurality of channels greater than two is preferably generated by the sequence of sputter deposition steps described herein. It should also be understood that the width of one or more channels may be determined by a plurality of NM atoms in one or more layers SP1-SP3.

Figure 20:
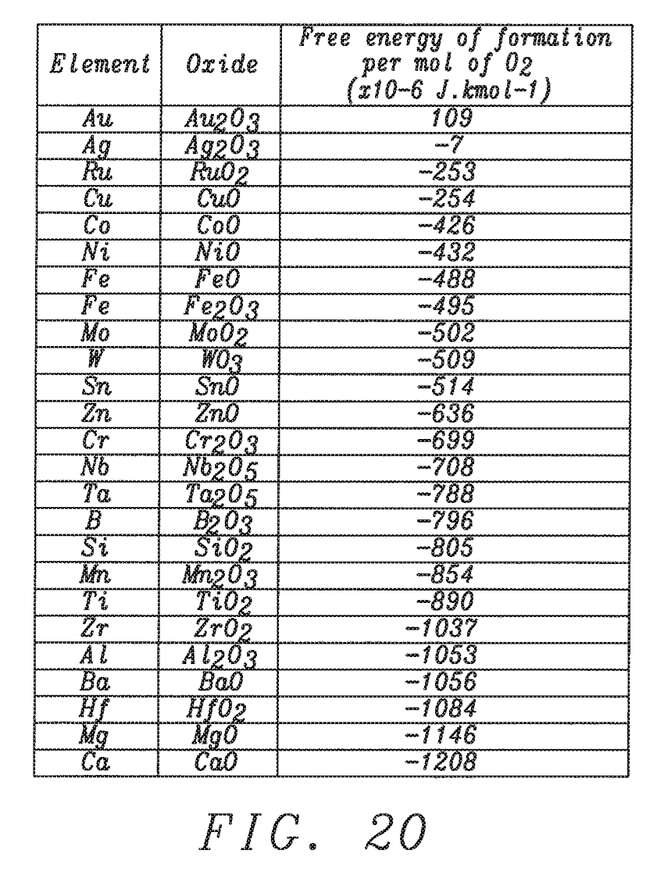
FIG. 20 is a table that lists the free energy of oxide formation for different elements.

Referring to FIG. 20, Mg or the M1 metal or alloy has a larger negative energy of oxide formation than the noble metals and is selectively oxidized during the oxidation step that is performed after the aforementioned deposition sequence. Accordingly, the NM metal that is one or more of Ag, Au, Pt, Au, Pd, Ru, Rh, Ir, Os, Mo, Fe, or the like, provides a plurality of conductive channels 15c in the MgO (or M1 metal or alloy) matrix after the oxidation step to provide electrical shorting paths through oxide matrix 17a in p-MTJ 2. Preferably, a substantial majority of the metal channels contact hard mask 16 and free layer 14. However, the presence of isolated NM atoms that are surrounded by the oxide matrix also lowers resistivity within the metal oxide layer.

In some embodiments (not shown), the first Mg (or another M1 metal or alloy) layer is oxidized before the NM layer is deposited, and then the second Mg (or another M1 metal or alloy) layer is deposited on the NM layer followed by a second oxidation step. Each of the steps of depositing the NM layer on the MgO layer, and depositing the second Mg layer on the NM layer may resputter portions of the MgO and NM layers, respectively, to yield NM channels in a MgO matrix following the second oxidation. In other embodiments, the NM metal and Mg (or another M1 metal or alloy used to form a metal oxide matrix) are co-sputtered from a single target or from separate targets in the sputter deposition tool before an oxidation step is performed to transform Mg atoms to a MgO matrix with NM channels therein. In yet another embodiment, a first MgO layer (A layer in FIG. 3a) may be sputter deposited on free layer 14 followed by deposition of the NM layer, and then a second A (MgO) layer is sputter deposited on the NM layer to form the stack of layers SP1-SP3 in FIG. 3b. During deposition of the second MgO layer, a number of NM atoms in the SP2 layer are effectively resputtered and then co-deposited with the second MgO layer to produce a MgO matrix (stacks of A atoms) with a plurality of NM channels therein including the 15c1, 15c2 pathways.

Figure 4:
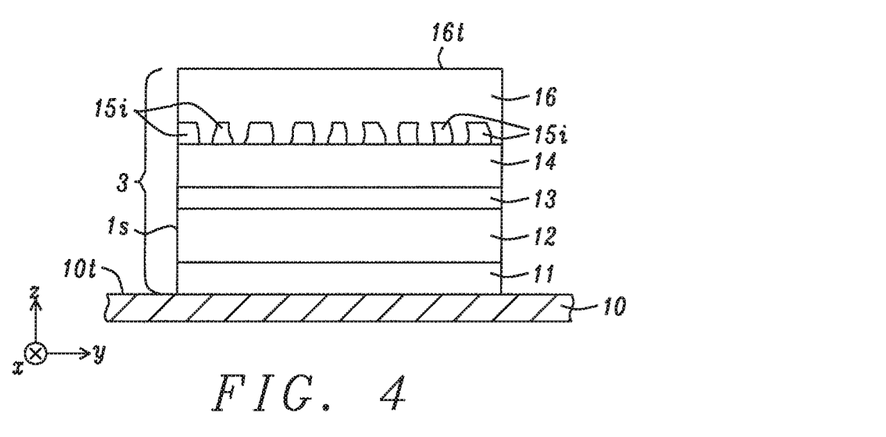
FIG. 4 is a cross-sectional view of a p-MTJ according to a second embodiment of the present disclosure wherein a discontinuous layer of metal oxide islands is formed on a free layer to reduce the RA product in a p-MTJ nanopillar.
Figure 5:
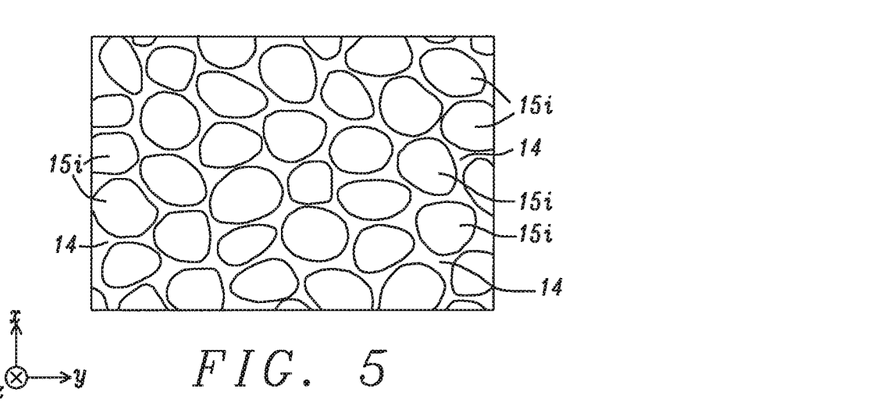
FIG. 5 is a top-down view of the metal islands in FIG. 4, and shows spaces between islands that are filled with a subsequently deposited metal layer.

According to FIG. 4, a second embodiment (p-MTJ 3) is depicted where conductive pathways are formed in a metal oxide layer to electrically connect free layer 14 with a metal layer in hard mask 16. Here, a discontinuous layer comprised of a M1 metal or metal alloy is formed on the free layer by a low pressure PVD method, for example. We previously disclosed a PVD method for depositing a 1 to 3 Angstroms thick discontinuous Mg layer on a free layer in U.S. Pat. No. 8,981,505. Here, the M1 metal or alloy is preferably one of Mg, MgAl, MgTi, MgGa, Ti, AlTi, MgZn, MgZr, Al, Zn, Zr, Hf, SrTi, BaTi, CaTi, LaAl, V, or MgTa as described previously in the first embodiment. Next, a natural oxidation (NOX) or the like is performed to oxidize the metal or metal alloy thereby providing a plurality of metal oxide islands 15i with spaces that expose a portion of the top surface of free layer 14 as shown in FIG. 5. Thereafter, the hard mask that is a non-magnetic conductive material is deposited on the metal oxide islands and fills the spaces such that the hard mask contacts exposed surfaces of the free layer. In some embodiments, the hard mask has a plurality of layers (not shown) but at least the bottommost layer in the hard mask stack fills the spaces between adjacent metal oxide islands 15i.

From a top-down view in FIG. 5 with the hard mask and overlying layers removed, the metal oxide islands 15i have irregular shapes and preferably cover a majority of the top surface of free layer 14. Note that the PVD deposition of Mg islands, for example, typically comprises a temperature between room temperature and 400° C. in the reaction chamber. In particular, increasing the PVD temperature decreases the surface area coverage of the Mg islands. However, the upper limit for PVD temperature in this case is usually 400° C. so as not to adversely affect free layer thermal stability. We have discovered that PVD deposition of a discontinuous Mg layer is preferably performed between room temperature and 350° C. to optimize adhesion to the free layer and form islands on the free layer top surface. In other words, Mg deposition temperature may be used to control the surface coverage and adhesion of the subsequently formed MgO islands thereby tuning the MgO/free layer contact area and magnitude of interfacial perpendicular anisotropy at the MgO/free layer interface. Consequently, the series resistance contribution of the cap layer (MgO islands) and free layer PMA are directly related to the % of free layer top surface contacted by MgO islands, and the % of free layer top surface in contact with the conductive hard mask 16. There is a trade off in that higher metal oxide surface coverage leads to greater PMA but at a cost of higher series resistance. It should be understood that the oxidation state of the MgO islands may be reduced to further lower the series resistance contribution of the metal oxide cap layer 15i.

The total RA value for p-MTJ 3 is determined by a contribution from each of the metal oxide layers and is represented by the equation $RA_{TOTAL}=(RA_{barrier}+RA_{cap})$ where $RA_{barrier}$, and $RA_{cap}$ are the resistance×area product for the tunnel barrier 13, and metal oxide islands 15i, respectively. RA value is dependent on thickness, and the oxidation state of an oxide layer. Therefore, the RA value may be adjusted lower by using a thinner layer for the tunnel barrier and metal oxide islands, if possible, and a lower oxidation state in one or both of the metal oxide layers. Typically, the aforementioned layers are already thinned to the extent possible with current technology without sacrificing other properties. Furthermore, lowering the oxidation state from stoichiometric MgO to non-stoichiometric MgO, for example, in layers 13, 15i will desirably lower RA, but also undesirably decrease the magnitude of interfacial perpendicular anisotropy at interfaces with the free layer, and thereby lower PMA in free layer 14. Thus, the present disclosure presents an attractive alternative where a plurality of conductive metal channels may be fabricated in the metal oxide cap layer to substantially maintain PMA in the free layer while lowering the $RA_{cap}$ contribution to $RA_{-TOTAL}$.

Figure 6:
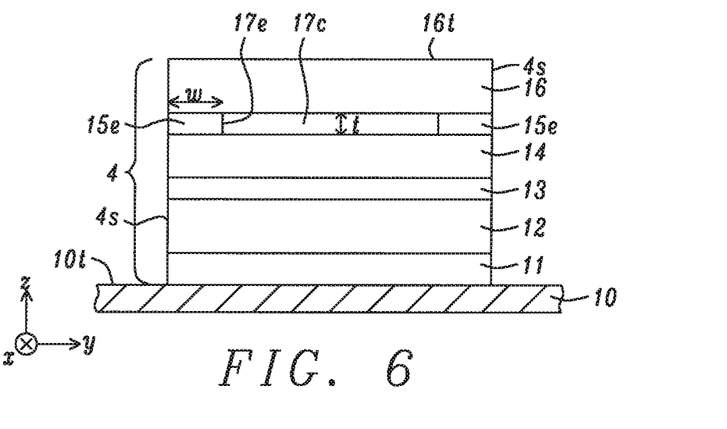
FIG. 6 is a cross-sectional view of a p-MTJ according to a third embodiment of the present disclosure and depicts a center portion of a metal oxide layer with a substantially stoichiometric oxygen content, and outer portions having substantially less than a stoichiometric oxygen content.

In another embodiment depicted in FIG. 6, a bottom spin valve configuration is shown for p-MTJ 4 wherein optional seed layer 11, reference layer 12, tunnel barrier layer 13, free layer 14, a cap layer with a metal oxide center portion 17c and conductive end portions 15e, and hard mask 16 are sequentially formed on bottom electrode 10. A key feature is that the metal oxide portion of the cap layer is limited to a center of the cap layer between sides 17e, and is separated from sidewall 4s by conductive end portions made of the same M1 metal or alloy as in the center portion. The M1 metal or alloy is one of Mg, MgAl, MgTi, MgGa, Ti, AlTi, MgZn, MgZr, Al, Zn, Zr, Hf, SrTi, BaTi, CaTi, LaAl, V, or MgTa. Conductive end portions have a width w from about 1 to 10 nm, and the same thickness t as the center portion. In other words, the present disclosure anticipates that a uniform metal oxide cap layer may be deposited on the free layer, but is subsequently reduced to a metal or to a non-stoichiometric oxidation state having a substantial number of metal atoms in conductive end portions proximate to sidewall 4s.

Figure 7:
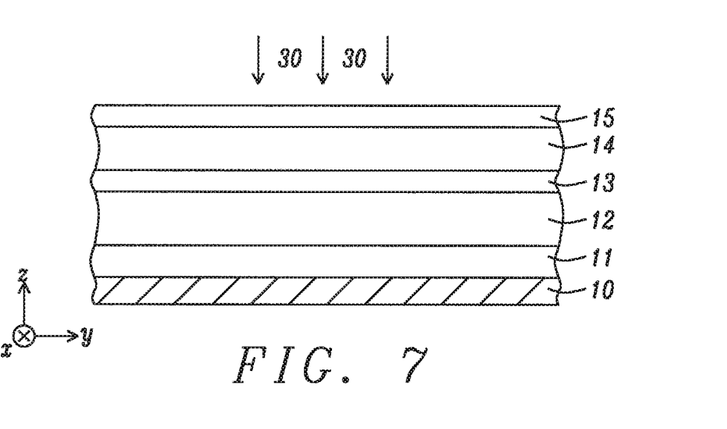
FIGS. 7-12 are cross-sectional views showing a process of forming a p-MTJ with a bottom spin valve configuration that is depicted in FIG. 6 according to an embodiment of the present disclosure.

A sequence of steps is depicted in FIGS. 7-12 according to one process flow for forming conductive end portions 15e and a center metal oxide portion 17c in the cap layer of p-MTJ 4. Referring to FIG. 7, seed layer 11, reference layer 12, tunnel barrier 13, and free layer 14 are sequentially formed on bottom electrode 10. In a preferred embodiment, a M1 metal or alloy layer 15 such as Mg is deposited on the free layer and then a natural oxidation step 30 is performed wherein oxygen is flowed into the reaction chamber for a period of time ranging from around 5 seconds to 5 minutes.

Figure 8:
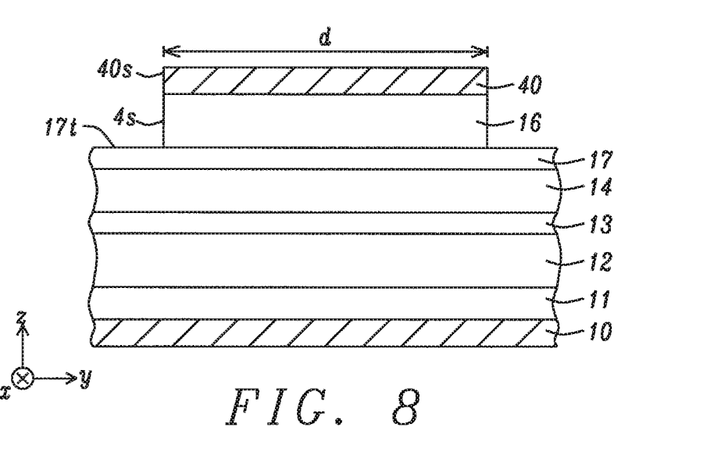

FIG. 8 shows an intermediate step of fabricating p-MTJ 4 after the Mg layer is converted to an MgO cap layer 17 by the NOX process, a hard mask 16 is formed on the MgO layer, and a photoresist layer is coated and patterned on the hard mask to yield a photoresist mask layer 40 with sidewall 40s. Width d is a critical dimension in the y-axis direction for the subsequently formed p-MTJ 4. A lengthwise dimension in the x-axis direction is not shown but may be equal to or greater than d, to yield a substantially circular or oval shape, respectively, from a top-down view. A reactive ion etch (RIE) step is employed to transfer the photoresist sidewall through the hard mask, and then stopping on top surface 17t of the cap layer. As a result, sidewall 4s on p-MTJ 4 is partially formed as a continuation of sidewall 40s, and critical dimension d is duplicated in the hard mask. The photoresist mask layer is then stripped by a conventional method.

Figure 9:
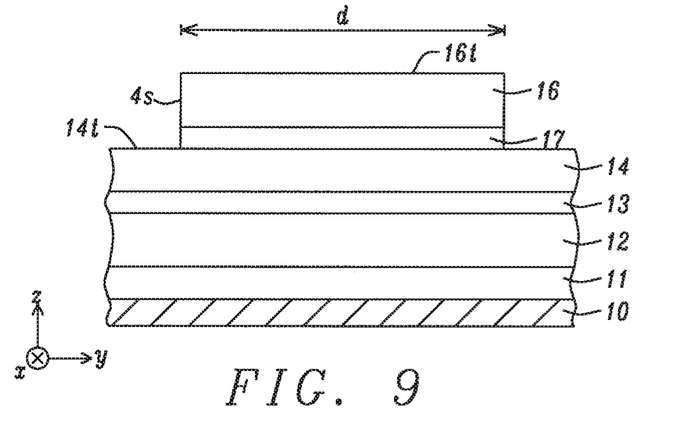

According to one embodiment in FIG. 9, a second RIE comprised of a second process gas comprised of one or more of methanol, CO, NH3, and Ar or another noble gas is used to transfer the pattern in hard mask 16 through the cap layer 17, and thereby extends sidewall 4s from top surface 16t to the free layer top surface 14t.

Figure 10:
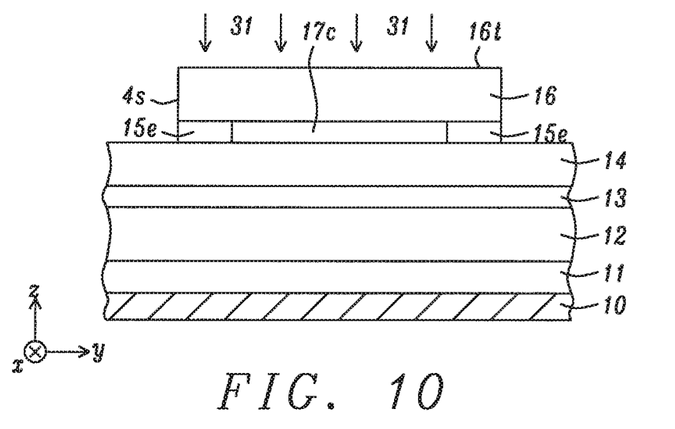

Referring to FIG. 10, a reduction treatment 31 with forming gas or hydrogen is employed in a reaction chamber to reduce portions of the cap layer proximate to sidewall 4s thereby forming end portions 15e comprised of Mg. In some embodiments, essentially all of the MgO proximate to the p-MTJ sidewall in cap layer 17 is reduced to Mg. In other embodiments, a substantial amount of MgO is converted to Mg such that a plurality of conductive pathways are established in end portions of the cap layer. Note that a lower concentration of Mg atoms may be formed with increasing distance from sidewall 4s depending upon the rate of horizontal diffusion of the forming gas or H2 through the cap layer, and reaction conditions in terms of time and pressure. The present disclosure anticipates that other reducing gases or reducing agents known in the art may be used in place of forming gas or hydrogen. For example, a plasma that is a reactive species comprised of one or more of a hydrogen radical (A), H+, OH−, or a hydroxyl radical (OH) and that is generated in the reaction chamber during the second RIE step with MeOH and Ar may serve as the reducing agent during formation of sidewall 4s along cap layer 17, and during a subsequent etch step that extends the sidewall to substrate top surface 10t. Alternatively, the reactive species may comprise one or more of a radical of CO, C, or $CH_3$, or a C—H radical (CH, $CH_2$, $CH_3$, $CH_4$).

Figure 11:
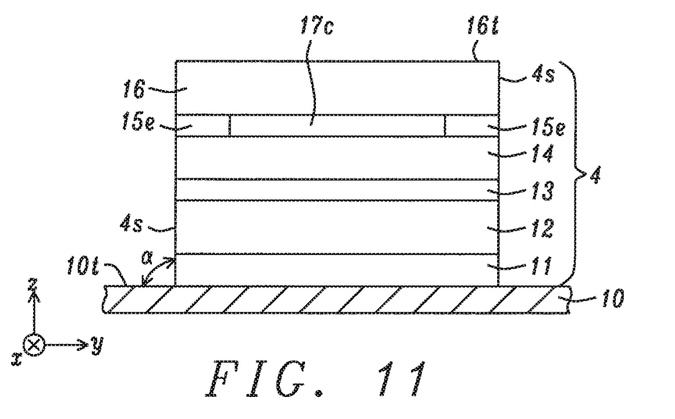

Referring to FIG. 11, a third etch step is performed after end portions 15e are formed in the cap layer, and may be a RIE with MeOH and Ar. The third etch step transfers the pattern with critical dimension d through the free layer, tunnel barrier layer 13, reference layer 12, and seed layer 11, and stops on the top surface 10t of bottom electrode 10. As a result, sidewall 4s is a continuous surface from hard mask top surface 16t to bottom electrode top surface 10t. Although sidewall angle a is shown to be vertical in the exemplary embodiments, angle a may be greater than 90° in other embodiments where the width of the seed layer 11 is greater than the width of the hard mask 16. An optional sputter clean step involving an ion beam etch (IBE) with Ar may be employed to remove any residue on sidewall 4s before proceeding to the following step.

Figure 12:
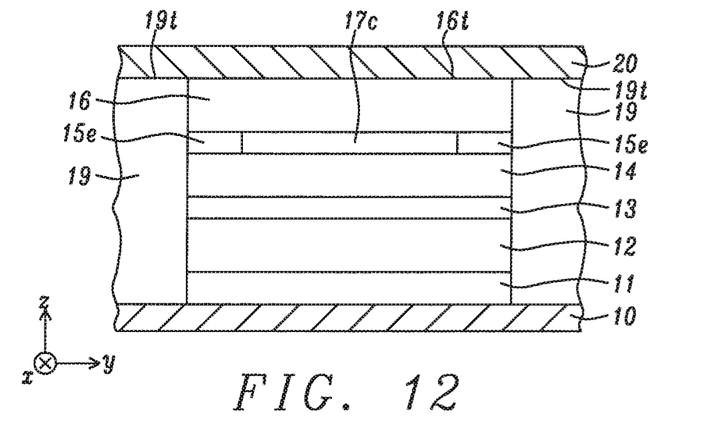
Figure 13:
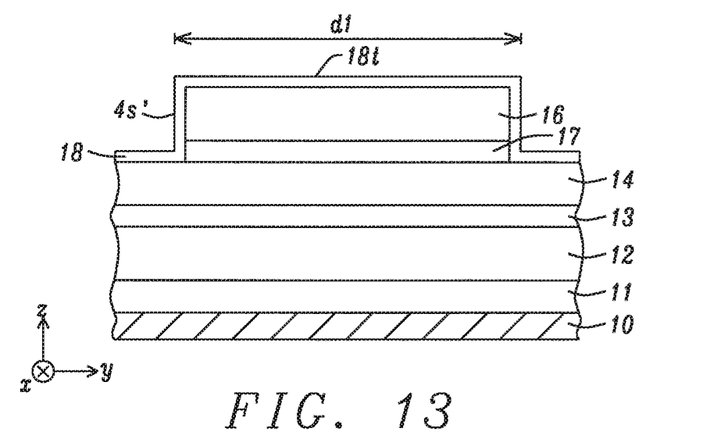
FIGS. 13-15 are cross-sectional views depicting an alternative method of forming the p-MTJ structure in FIG. 6.

Referring to FIG. 12, an encapsulation layer 19 is deposited on bottom electrode top surface 10t and adjoining sidewall 4s to fill the gaps between p-MTJ 4 and adjacent p-MTJs. Then, a chemical mechanical polish (CMP) step may be used to form a top surface 19t on the encapsulation layer that is coplanar with top surface 16t of the hard mask. Thereafter, a top electrode layer comprised of top electrode 20 is formed on the hard mask top surface by a conventional method. Note that the encapsulation layer may absorb oxygen from end portions 15e of the cap layer in embodiments where the end portions are in an under oxidized state and are not completely converted to a metal or alloy during the earlier exposure to a reducing agent, and especially when an elevated temperature up to 400° C. is applied during or following the encapsulation process for annealing purposes. In some embodiments, the encapsulation layer is comprised of a strongly reducing metal including but not limited to Ta, Al, Mg, Ti, Hf, La, Y, Zr, Fe, and B.

According to another embodiment of forming end portions 15e on either side of the center metal oxide portion 17c of the cap layer that is illustrated in FIGS. 13-15S, the reduction process starts with the intermediate p-MTJ structure shown in FIG. 9, and involves deposition of a metal layer 18 on top surface 16t and on sidewalls 4s after the initial etch step stops on free layer top surface 14t. Preferably, the deposition provides a conformal metal layer with a substantially uniform thickness. The metal may be a reducing agent, is conductive, and is preferably comprised of one of Ta, Al, Mg, Ti, Hf, La, Y, Zr, Fe, and B, and also serves as an efficient mask layer during a subsequent etch that transfers sidewall 4s' through underlying layers.

Figure 14:
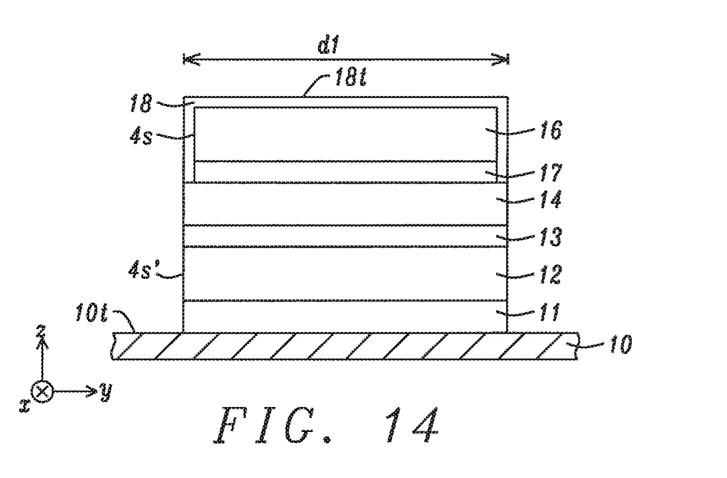

Referring to FIG. 14, a RIE with MeOH and Ar, for example, extends sidewall 4s' through free layer 14, tunnel barrier 13, reference layer 12, and seed layer 11 and stops on top surface 10t. Critical dimension d1 is larger than d in the previous embodiment. Since the RIE plasma is typically directed essentially orthogonal to the substrate, exposed top surface 18t1 above top surface 14t is also removed, but a substantial portion of metal layer 18 remains on sidewall 4s along the hard mask 16 and metal oxide cap layer 17. In some embodiments, the portion of metal layer with top surface 18t above the hard mask is also removed by the RIE step. The metal layer serves as an encapsulation layer for the hard mask and metal oxide cap layer.

Figure 15:
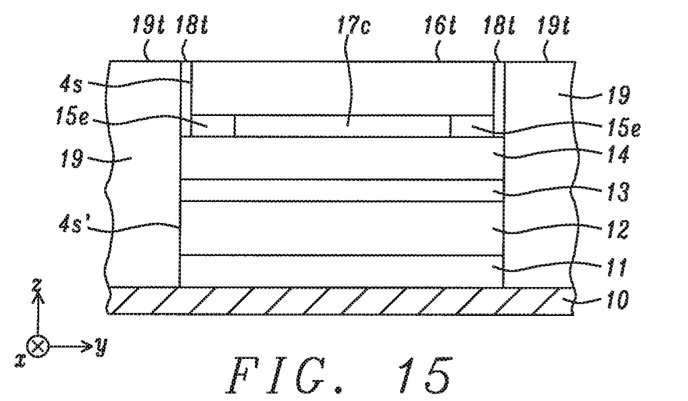

FIG. 15 depicts p-MTJ 4 after encapsulation layer 19 is formed on sidewalls 4s' to fill the openings between p-MTJ 4 and adjacent p-MTJs, and a CMP process is employed to form a top surface 19t on the encapsulation layer that is coplanar with top surface 18t of metal layer 18, and with top surface 16t of hard mask 16. The present disclosure anticipates that a solid state reaction occurs between the reducing metal in metal layer 18 and metal oxide layer 17 wherein oxygen is absorbed from metal oxide end portions into the metal layer thereby forming end portions 15e having a substantially reduced oxidation state compared with the original oxidation state in the cap layer. The solid state reaction may occur during deposition of the metal layer, and during any process step thereafter including annealing of p-MTJ 4 after sidewall 4s' is formed along the entire stack of layers, or during formation of encapsulation layer 19. Annealing may occur during encapsulation wherein the reaction temperature may be proximate to 400° C. to drive the solid state reaction at a faster rate. In embodiments where the metal encapsulation layer 18 does not absorb oxygen from the metal oxide layer 17, the encapsulation layer 18 provides the conductive channel required to cause an electrical short of the metal oxide layer 17.

Figure 16:
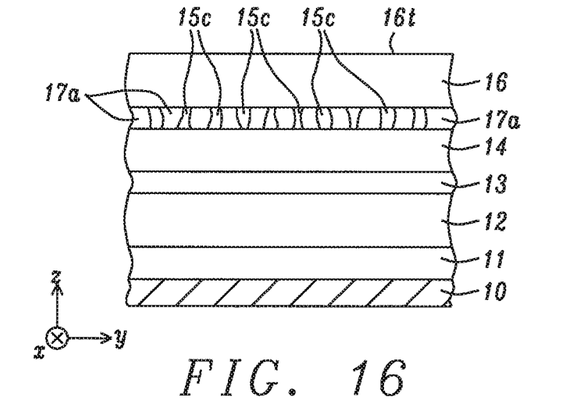
FIG. 16 is a cross-sectional view of a p-MTJ having a top spin valve configuration that represents a modification of the p-MTJ in FIG. 2 according to an embodiment of the present disclosure.

The present disclosure also encompasses an embodiment wherein the reduction process shown in FIGS. 7-12 (or in FIGS. 13-15) may be applied to a metal oxide layer already having a plurality of conductive channels therein. For example, metal oxide layer 17 in the p-MTJ stack of layers may be replaced by metal oxide layer 17a with a plurality of conductive channels 15c to provide the p-MTJ stack of layers in FIG. 16.

Figure 17:
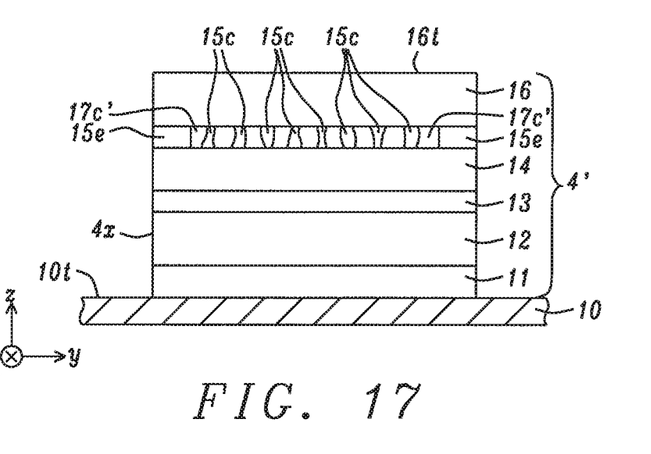
FIG. 17 is a cross-sectional view of a p-MTJ with a top spin valve configuration that represents a modification of the p-MTJ in FIG. 6 according to an embodiment of the present disclosure.

Thereafter as shown in FIG. 17, the process steps represented in FIGS. 8-11 are followed to yield p-MTJ 4' having sidewall 4x. In particular, the p-MTJ has a metal oxide center portion 17c' having conductive channels 15c therein, and the center portion is separated from the sidewall by end portions 15e with an oxidation state substantially less than the oxidation state in the metal oxide center portion. In some embodiments, the end portions are effectively conductive channels of the first metal or alloy M1 in the metal oxide layer 17c while the conductive channels 15c are comprised of a second metal that is one of the noble metals (NM) described previously such that the first metal or alloy has a composition different from the second metal.

Figure 18:
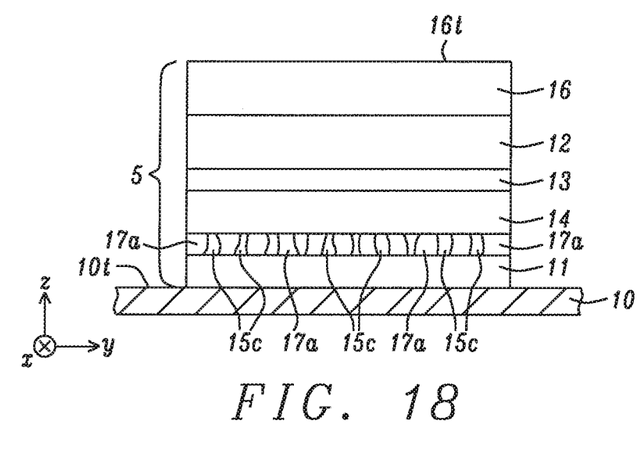
FIG. 18 is a cross-sectional view depicting an unpatterned p-MTJ stack of layers wherein a free layer is formed between a tunnel barrier and a metal oxide layer having a plurality of conductive channels therein.

In FIG. 18, another embodiment of the present disclosure is depicted that retains all of the layers from the first embodiment in FIG. 2 except the ordering of the layers is different. A top-spin valve configuration for p-MTJ 5 is shown wherein seed layer 11, metal oxide layer 17a with metal channels 15c formed therein, free layer 14, tunnel barrier 13, reference layer 12, and hard mask 16 are sequentially formed on bottom electrode 10. Metal channels extend from a top surface of the seed layer to a bottom surface of the free layer. As mentioned earlier, metal channels 15c may be comprised of the same metal or alloy as in the metal oxide layer, or may be one of the NM metal or alloys described previously. A key feature is that electrical shorting pathways 15c are provided in the metal oxide layer to reduce the parasitic resistance contribution of metal oxide layer 17a to $RA_{TOTAL}$ for the p-MTJ. Here, the metal oxide layer is referred to as an Hk enhancing layer rather than a cap layer since PMA in the free layer is increased due to interfacial perpendicular anisotropy generated at the interface of the free layer bottom surface with the underlying metal oxide layer.

Figure 19:
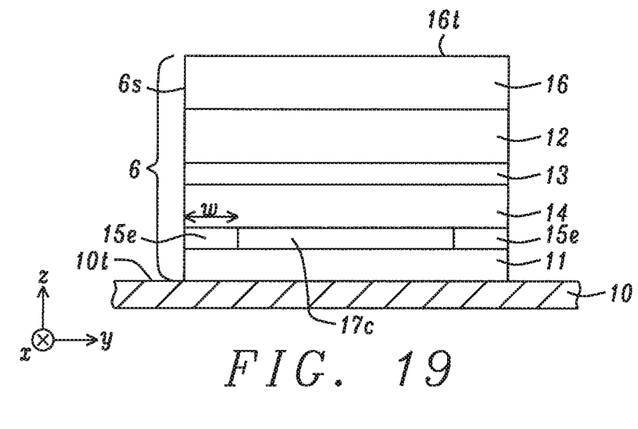
FIG. 19 is a cross-sectional view of the p-MTJ stack in FIG. 18 after a process flow according to the present disclosure is used to generate a p-MTJ nanopillar wherein the metal oxide layer has a center portion with conductive channels, and two end portions with a substantially reduced oxidation state.

In another top spin valve embodiment shown in FIG. 19, the bottom spin valve configuration in FIG. 6 is modified by retaining all of the p-MTJ layers, but the order of deposition is changed to yield a p-MTJ 6 wherein the seed layer 11, metal oxide layer 17c with end portions 15e, free layer 14, tunnel barrier 13, reference layer 12, and hard mask 16 are sequentially formed on bottom electrode 10. Metal oxide layer 17c is considered to be a Hk enhancing layer since it is no longer a cap layer above the free layer. End portions 15e are comprised of the same metal or metal alloy as in the metal oxide layer and provide conductive channels around a center metal oxide portion 17c. As described previously, the end portions are reduced by exposure of a uniform metal oxide layer to a reducing agent or a reducing species that may be in the form of a metal layer (not shown) deposited on the side of an etched metal oxide layer, or performing a reduction process with forming gas or $H_2$, or with one or both of radicals and ions described previously.

All of the embodiments described herein may be incorporated in a manufacturing scheme with standard tools and processes. $RA_{TOTAL}$ for p-MTJ nanopillars is significantly reduced while substantially maintaining DRR and free layer thermal stability which is an advantage in enabling 64 Mb and 256 Mb STT-MRAM technology, and related spintronic devices where switching current, RA value, DRR, and thermal stability are all critical parameters.

While the present disclosure has been particularly shown and described with reference to, the preferred embodiment thereof, it will be understood by those skilled in the art that various changes in form and details may be made without departing from the spirit and scope of this disclosure.

What is claimed is:

1. A device comprising:
a tunnel barrier layer that includes a first metal oxide layer, the tunnel barrier layer disposed between a reference layer and a free layer;
a second metal oxide layer physically contacting a second surface of the free layer that is opposite with respect to a first surface of the free layer that contacts the tunnel barrier layer, the second metal oxide layer including a plurality of conductive pathways therein that extend from a top surface to a bottom surface of the second metal oxide layer, wherein the second metal oxide layer includes a metal or metal alloy and wherein the plurality of conductive pathways are made of a noble metal that is different from the metal or metal alloy; and
the free layer physically contacting the tunnel barrier and the second metal oxide layer to generate interfacial perpendicular anisotropy resulting in perpendicular magnetic anisotropy PMA in the free layer.

2. The device of claim 1, wherein the second metal oxide layer includes a central portion having a first oxidation state and opposing end portions disposed on either side of the central portion having a second oxidation state that is less than the first oxidation state.

3. The device of claim 1, wherein the second metal oxide includes a material selected from the group consisting of Mg, MgAl, MgTi, MgGa, Ti, AlTi, MgZn, MgZr, Al, Zn, Zr, Hf, SrTi, BaTi, CaTi, LaAl, V and MgTa.

4. The device of claim 1, further comprising:
a hard mask disposed over the second metal oxide layer;
a top electrode;
a bottom electrode, and
a seed layer having a bottom surface that physically contacts the bottom electrode and a top surface that physically contacts the reference layer.

5. The device of claim 1, further comprising:
a hard mask disposed over the reference layer;
a top electrode;
a bottom electrode; and
a seed layer having a bottom surface that physically contacts the bottom electrode and a top surface that physically contacts the second metal oxide layer.

6. The device of claim 1 wherein the device is selected from the group consisting of a magnetic random access memory (MRAM), a spin torque (STT)-MRAM, sensor, biosensor, and a spin torque oscillator.

7. The device of claim 1, wherein the noble metal is selected from the group consisting of Ag, Au, Pt, Au, Pd, Ru, Rh, Ir, Mo, Fe and Os.

8. A device comprising:
a tunnel barrier layer that includes a first metal oxide layer, the tunnel barrier layer disposed between a reference layer and a free layer;
a cap layer including a bottom surface physically contacting a second surface of the free layer that is opposite with respect to a first surface of the free layer that contacts the tunnel barrier layer, the cap layer including a top surface that opposes the bottom surface and a first outermost sidewall surface and an opposing second outermost sidewall surface, wherein the first outermost sidewall surface and the opposing second outermost sidewall surface extend from the bottom surface to the top surface of the cap layer, the cap layer further including:
a center portion that is formed of a second metal oxide layer with a first oxidation state, the second metal oxide layer including a metal or metal alloy; and
an outer portion having a second oxidation state that extends from the first outermost sidewall surface of the cap layer to the center portion, the outer portion including the metal or alloy M1, the second oxidation state that is being less than the first oxidation state; and
the free layer physically contacting the tunnel barrier and the second metal oxide layer to generate interfacial perpendicular anisotropy resulting in perpendicular magnetic anisotropy in the free layer.

9. The device of claim 8, wherein the outer portion of the cap layer is conductive.

10. The device of claim 8, wherein the metal or alloy M1 is one of Mg, MgAl, MgTi, MgGa, Ti, AlTi, MgZn, MgZr, Al, Zn, Zr, Hf, SrTi, BaTi, CaTi, LaAl, V, or MgTa.

11. The device of claim 8, further comprising
a hard mask disposed over the second metal oxide layer;
a top electrode;
a bottom electrode, and
a seed layer having a bottom surface that physically contacts the bottom electrode and a top surface that physically contacts the reference layer.

12. The device of claim 8, further comprising:
a hard mask disposed over the reference layer;
a top electrode;
a bottom electrode; and
a seed layer having a bottom surface that physically contacts the bottom electrode and a top surface that physically contacts the second metal oxide layer.

13. The device of claim 8, wherein the second metal oxide layer further comprises conductive pathways that extend from a top surface to a bottom surface of the second metal oxide layer.

14. The magnetic element of claim 13, wherein the conductive pathways are made of a noble metal that is different from the metal or metal alloy.

15. The magnetic element of claim 14, wherein the noble metal is selected from the group consisting of Ag, Au, Pt, Au, Pd, Ru, Rh, Ir, Mo, Fe and Os.

16. The device of claim 8, wherein the cap layer further includes another outer portion having the second oxidation state that extends from the second outermost sidewall surface of the cap layer to the center portion, the another outer portion including the metal or alloy M1, the another outer portion being on a first side of the center portion and the outer portion being on second side of the center portion that is opposite the first side.

17. A device comprising:
a tunnel barrier layer disposed over a reference layer;
a free layer disposed on the tunnel barrier layer;
a plurality of metal oxide islands disposed directly on a top surface of the free layer, and wherein adjacent islands of the plurality of metal oxides islands are spaced apart from each other; and
a non-magnetic hard mask layer disposed directly on the plurality of metal oxides islands and extending between adjacent islands to the top surface of the free layer such that the non-magnetic hard mask layer physically contacts the top surface of the free layer.

18. The device of claim 17, wherein the plurality of metal oxide islands includes a material selected from the group consisting of MgO, AlOx, MgAlOx, MgTiOx, TiOx, AlTiOx, MgZnO, ZnO, ZrOx, HfOx and MgTaO.

19. The device of claim 17, wherein the plurality of metal oxide islands includes a first metal oxide island having opposing sidewall surfaces and top surface extending between the opposing sidewall surfaces, and
wherein the non-magnetic hard mask layer physically contacts the top surface and the opposing sidewall surfaces of the first metal oxide island.

20. The device of claim 17, wherein the non-magnetic hard mask layer is conductive.

* * * * *